United States Patent
Malone et al.

(10) Patent No.: US 7,031,688 B2
(45) Date of Patent: Apr. 18, 2006

(54) DIRECT-CONVERSION RECEIVER SYSTEM AND METHOD WITH QUADRATURE BALANCING AND DC OFFSET REMOVAL

(75) Inventors: Lawrence J. Malone, Carlsbad, CA (US); Lon W. Christensen, San Diego, CA (US)

(73) Assignee: Quorum Systems, Inc., San Diego, CA (US)

( * ) Notice: Subject to any disclaimer, the term of this patent is extended or adjusted under 35 U.S.C. 154(b) by 0 days.

(21) Appl. No.: 10/807,208

(22) Filed: Mar. 22, 2004

(65) Prior Publication Data

US 2004/0190647 A1  Sep. 30, 2004

Related U.S. Application Data

(60) Provisional application No. 60/456,509, filed on Mar. 24, 2003.

(51) Int. Cl.
  *H04B 1/26* (2006.01)
(52) U.S. Cl. .................. 455/318; 455/323; 455/324

(58) Field of Classification Search .............. 455/318, 455/323, 256, 257, 258, 265, 296, 305, 313, 455/315, 319, 326, 324
See application file for complete search history.

(56) References Cited

U.S. PATENT DOCUMENTS

| | | | |
|---|---|---|---|
| 6,016,422 A | 1/2000 | Bartusiak | |
| 6,055,429 A | 4/2000 | Lynch | |
| 6,064,664 A | 5/2000 | Kim | |
| 6,192,225 B1 * | 2/2001 | Arpaia et al. ............. | 455/196.1 |
| 6,308,058 B1 * | 10/2001 | Souetinov et al. .......... | 455/326 |
| 6,385,439 B1 | 5/2002 | Hellberg | |
| 6,545,516 B1 * | 4/2003 | Ylamurto et al. ........... | 327/113 |
| 6,597,899 B1 * | 7/2003 | Souetinov et al. .......... | 455/323 |
| 6,665,159 B1 | 12/2003 | Takikawa | |
| 6,785,529 B1 * | 8/2004 | Ciccarelli et al. ........... | 455/324 |

\* cited by examiner

*Primary Examiner*—Edward F. Urban
*Assistant Examiner*—Blane J. Jackson
(74) *Attorney, Agent, or Firm*—Townsend and Townsend and Crew (57) ABSTRACT

A system and method are provided for direct-conversion of a modulated radio-frequency (RF) signal. After receiving an RF signal, the RF signal is mixed with a plurality of oscillator signals with different phases in an interleaving manner.

20 Claims, 7 Drawing Sheets

DIRECT-CONVERSION RECEIVER SYSTEM AND METHOD WITH QUADRATURE BALANCING AND DC OFFSET REMOVAL

RELATED APPLICATION(S)

This application claims the benefit of U.S. Provisional Application No. 60/456,510, filed Mar. 24, 2003, entitled DIRECT CONVERSION RECEIVER WITH QUADRATURE BALANCING AND DC OFFSET REMOVAL.

FIELD OF THE INVENTION

The present invention relates to circuitry, and more particularly to direct-conversion circuitry.

BACKGROUND OF THE INVENTION

Direct-conversion is a wireless receiver architecture particularly suited to highly integrated, low-power terminals. Its advantage over traditional superheterodyne architectures is that the received signal is amplified and filtered at baseband rather than at some higher intermediate frequency. This architecture results in lower current consumption in the baseband circuitry and a simpler frequency plan.

In direct-conversion receivers, the most serious drawback is that the direct current (DC) offset generated by the down-conversion mixers and baseband circuitry. This offset appears in the middle of the down converted signal spectrum, corrupting the signal.

The first cause of DC offset is the transistor mismatch of the baseband components such as the down-conversion mixers and buffers. This is static DC offset. In addition, there is dynamic DC offset. One source of dynamic DC offset occurs when the local oscillator (LO) leaks into the front end of the receiver through the integrated circuit substrate. This signal is down converted to DC. Another source of dynamic DC offset occurs when the LO leaks out the antenna and reflects off external objects and back into the receiver. This too is down converted to DC.

DC offsets may be removed through capacitive coupling if the signal modulation is tolerant to the phase distortion cause by capacitor-resistor (CR) coupling. In addition, DC offsets may be estimated and digitally removed at the cost of additional hardware size and complexity.

Another problem in direct-conversion receivers is in-phase and quadrature ("IQ") imbalance of the LO and receiver. In the art, it is well known that direct-conversion transmitter and receivers need a local oscillator with quadrature outputs for vector modulation and demodulation. However, when the quadrature outputs are not equal in amplitude and not exactly 90 degrees out of phase, demodulation becomes more difficult requiring a higher signal-to-noise ratio to properly decode the signal.

Quadrature phases are typically derived by passing a reference local oscillator through a CR-RC phase shift network. Ideally, this creates two signals with equal amplitude and 90 degrees of phase difference. However, this depends on the accuracy of resistors and capacitors which make up the phase shift network. The resistors and capacitors can vary by up to 15 percent in a typical integrated circuit causing the in-phase and quadrature components to have different amplitudes and a phase difference not equal to 90 degrees.

In addition, layout differences between the in-phase and quadrature paths can cause additional amplitude/phase imbalance. Contributing to further in-phase/quadrature imbalance is the circuits in the in-phase and quadrature paths, such as amplifiers and mixers, the physical properties of which differ slightly. Many feedback calibration schemes have been proposed and implemented to mitigate quadrature imbalance at the cost of hardware and/or system complexity.

In addition to DC offset and quadrature imbalance, radio-frequency (RF) integrated circuits suffer from self-generated interference. Specifically, signals from one part of the integrated circuit couple to another part of the integrated circuit. The RF section of an integrated circuit is the most susceptible portion since the received signal has not been fully amplified. One way to combat this problem is to turn the signal from single-ended to differential. A differential signal is comprised of a negative and a positive component. This adds to the signal's resilience to self interference.

Figure 1:
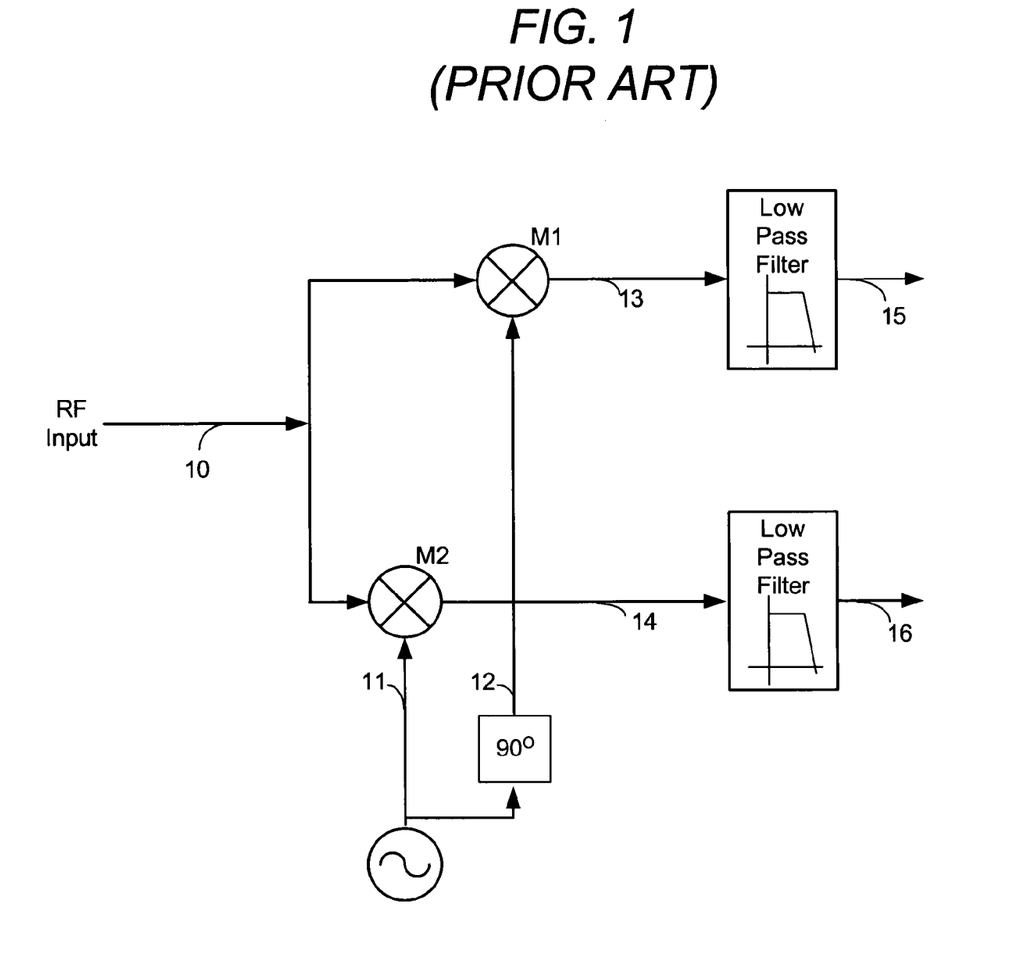
FIG. 1 is a block diagram of a conventional single-ended direct-conversion receiver, in accordance with the prior art.

A conventional direct-conversion receiver is illustrated in FIG. 1. As illustrated in FIG. 1, a direct-conversion receiver takes an RF signal 10 characterized by a modulation bandwidth and a center frequency. The LO produces a sinusoidal signal which has the same frequency as the RF signal center frequency, as is typical for direct-conversion receivers. As an example, a Bluetooth™ signal might be transmitted at 2440 MHz therefore the LO may produce a 2440 MHz sinusoidal signal for down conversion.

Furthermore, the receiver multiplies the RF signal not with one but with two different phases 11, 12 of the LO. The two phases 11, 12 of the local oscillator are 90 degrees apart and thus, are known as the in-phase (I) 11 and quadrature (Q) 12 components. Through this disclosure, the in-phase local oscillator signal is denoted $LO_I$ and the quadrature local oscillator signal is denoted $LO_Q$. The mixer outputs 13, 14 are known as baseband signals since they are at a lower frequency than the RF signal. The baseband signals are in-phase and quadrature corresponding to the in-phase and quadrature local oscillator signals. The baseband signals are low pass filtered as to remove unwanted interfering signals. Through this disclosure, the in-phase baseband signal is denoted $BB_I$ and the quadrature baseband signal is denoted $BB_Q$. The resulting filtered baseband signals 15, 16 can be represented by Equations 1 and 2.

$$BB_I = RF \times LO_I \qquad \text{Equation 1}$$

$$BB_Q = RF \times LO_Q \qquad \text{Equation 2}$$

Figure 2:
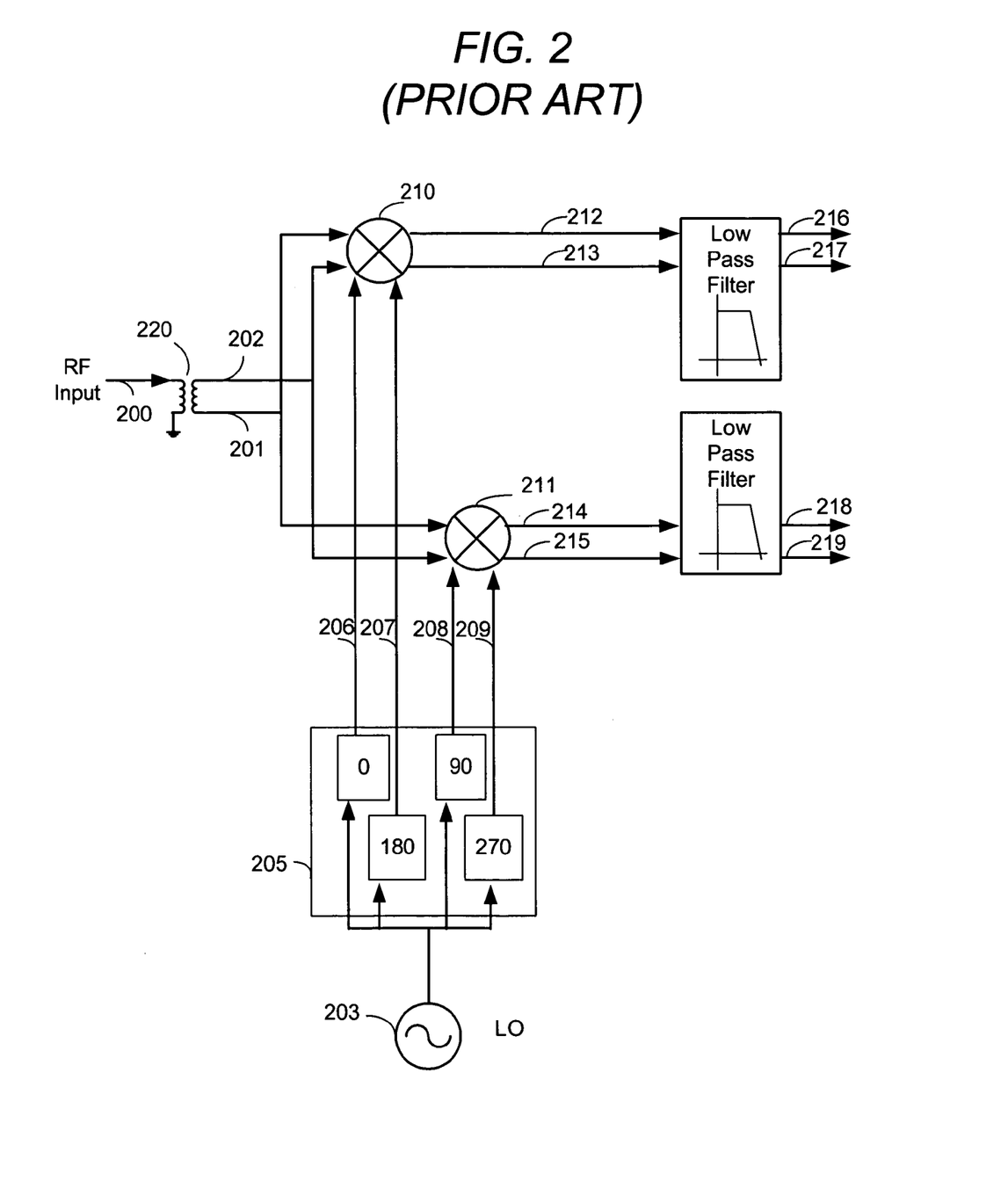
FIG. 2 is a block diagram of a conventional differential direct-conversion receiver, in accordance with the prior art.

Another conventional direct-conversion architecture is shown in FIG. 2. This differential direct-conversion architecture is more resilient to self-generated noise than the one illustrated in FIG. 1. In FIG. 2, the RF input signal 200 is converted by a balun 220 to a differential signal composed of positive and negative components 201, 202 respectively. The relationship between the RF input 200 and the differential components 201, 202 are described by Equation 3.

$$RF = (RF_{pos} - RF_{neg}) \qquad \text{Equation 3}$$

Similarly, the differential direct-conversion architecture shown in FIG. 2 uses differential LO signals to mix the RF signal down to baseband. The polyphase network 205 is a circuit which converts the local oscillator's voltage waveform 203 into four voltage waveforms 206, 207, 208, 209 at the same frequency as the LO 203 but at 0, 180, 90, 270 degrees offset compared to the LO signal 203 respectively.

Collectively, these four signals 206, 207, 208, 209 are referred to as polyphase local oscillator signals. To facilitate the description of this embodiment, these signals are denoted 206, 207, 208, 209 as $LO^0$, $LO^{180}$, $LO^{90}$, $LO^{270}$ corresponding to their phase shift compared to the local oscillator 203. It is well known in the art that shifting a sinusoidal signal 180 degrees in phase is the same as inverting the signal. Therefore, the equivalent single-ended in-phase and quadrature LO signals are described mathematically as in Equations 4 and 5.

$$LO_I = LO^0 - LO^{180} \qquad \text{Equation 4}$$

$$LO_Q = LO^{90} - LO^{270} \qquad \text{Equation 5}$$

The differential RF signal 201, 202 is then routed to the differential mixers 210, 211 where it is multiplied by the differential local oscillator signals. At the first mixer 210, the differential RF signal is multiplied by the in-phase LO ($LO_I$) to generate the differential in-phase baseband signal 212, 213 ($BB_I$). Likewise, at the second mixer 211, the differential RF signal is multiplied by the quadrature LO ($LO_Q$) to generate the differential quadrature baseband signal 214, 215 ($BB_Q$). Equations 6 and 7 describe the mixing process of the differential signals to generate the $BB_I$ and the $BB_Q$.

$$BB_I = (BB_{I,pos} - BB_{I,neg}) = (RF_{pos} - RF_{neg}) \times (LO^0 - LO^{180}) \qquad \text{Equation 6}$$

$$BB_Q = (BB_{Q,pos} - BB_{Q,neg}) = (RF_{pos} - RF_{neg}) \times (LO^{90} - LO^{270}) \qquad \text{Equation 7}$$

As in the single-ended case, the baseband signals 212, 213, 214, 215 can be filtered to remove unwanted interfering signals to produce filtered baseband signals 216, 217, 218, 219.

Now, to elucidate the problems with direct-conversion receivers, DC offset and imbalance distortions will be added to Equations 6 and 7. DC offsets are added to the output of the mixers. DC 1 represents the differential DC offset of the first mixer 210 and DC2 represents the differential DC offset of the second mixer 211. Likewise the amplitude and phase imbalance of the mixers and the polyphase LO signals can be accounted for at the output of each mixer. A complex multiplicative term, $A1e^{jP1}$, represents a random amplitude variation (A1) and a random phase variation (P1) introduced by the first mixer 210 and the signal path and LO path connected to the mixer. Likewise, $A2e^{jP2}$ represents a random amplitude and phase variation introduced by the second mixer 211 and the signal and LO paths connected thereto. Thus, with these distortions added, Equations 6 and 7 become Equations 11 and 12.

$$BB_I = (RF_{pos} - RF_{neg}) \times (LO^0 - LO^{180}) \times A1e^{jP1} + DC1 \qquad \text{Equation 11}$$

$$BB_Q = (RF_{pos} - RF_{neg}) \times (LO^{90} - LO^{270}) \times A2e^{jP2} + DC2 \qquad \text{Equation 12}$$

As seen in Equations 11 and 12, the baseband in-phase and quadrature signals imbalance grows as A1 and A2 differ and as P1 and P2 differ. As the imbalance increases, it is harder for the signal to be received and decoded. Likewise, as DC1 and DC2 get larger, and thus depart from the ideal of no DC offset, it becomes more difficult for the signal to be received and decoded.

SUMMARY OF THE INVENTION

A system and method are provided for direct-conversion of a modulated radio-frequency (RF) signal. After receiving an RF signal, the RF signal is mixed with a plurality of oscillator signals with different phases in an interleaving manner.

In one embodiment, the RF signal may be converted to a differential RF signal. Further, the RF signal may be modulated over a finite bandwidth.

In another embodiment, the oscillator signals may include an oscillator signal frequency substantially equal to an RF signal frequency of the RF signal. Optionally, the oscillator signals may have phase differences of 0, 90, 180 and 270 degrees.

In still another embodiment, the mixing may be carried out by a plurality of mixers. Further, the oscillator signals may be input to the mixers in the interleaving manner. For example, the oscillator signals may be input to the mixers in the interleaving manner by switching which oscillator signals are input to which mixers.

As an option, such switching may occur at a rate that is faster than a bandwidth of the RF signal. Further, the switching may occur in a substantially random manner, or even in a completely random manner.

In still yet another embodiment, a modulation of the RF signal may be reconstructed as a quadrature baseband signal and an in-phase baseband signal with a de-interleaving operation. Optionally, such de-interleaving operation may include inverting and routing operations.

Still yet, low-pass filtering may be applied to the in-phase baseband signal and the quadrature baseband signal.

In use, a direct current (DC) offset of the in-phase baseband signal and the quadrature baseband signal may thus be removed. Further, an amplitude and a phase distortion in the in-phase baseband signal and the quadrature baseband signal may be equated or reduced.

DETAILED DESCRIPTION

Figure 3:
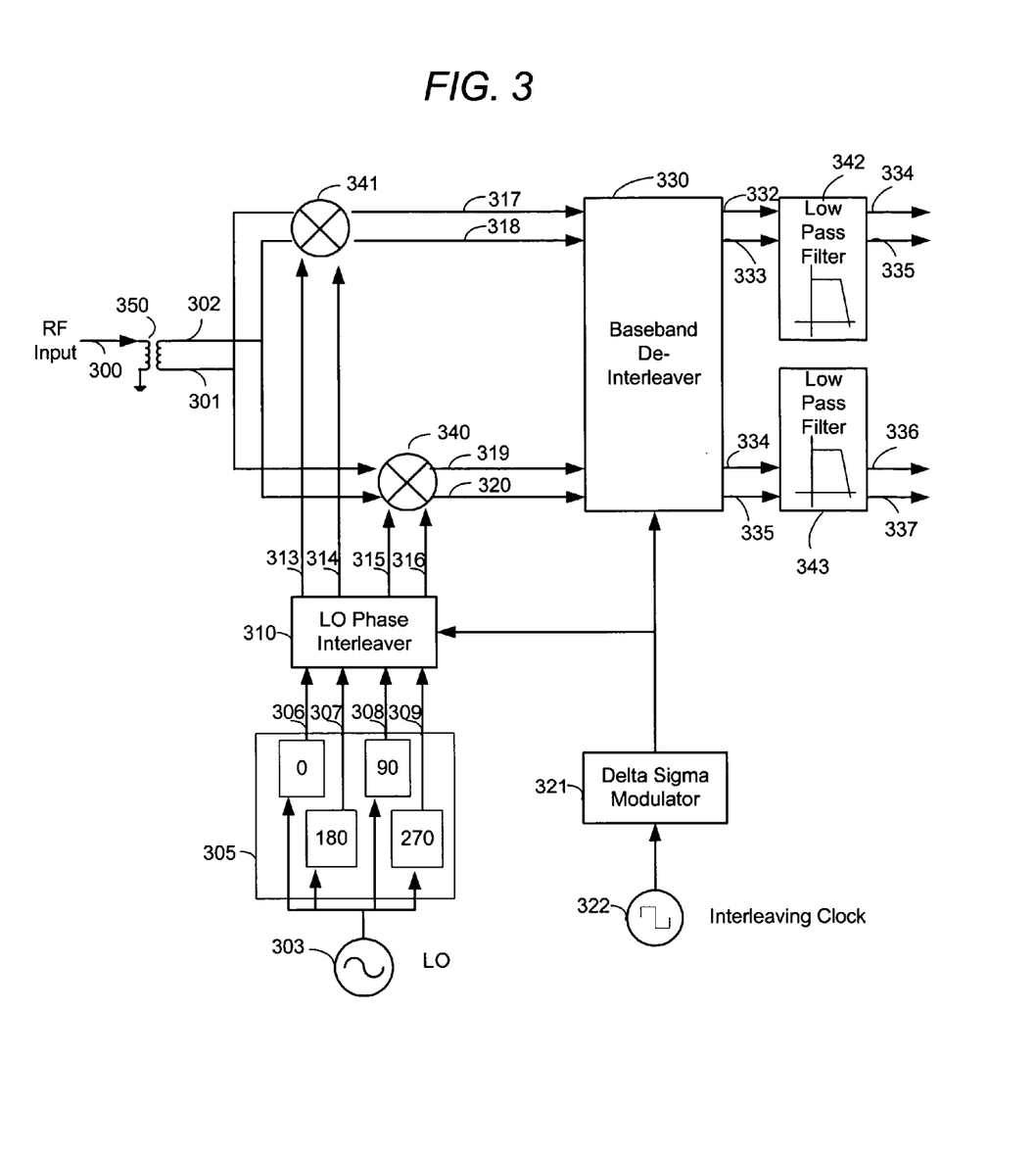
FIG. 3 is a block diagram of a differential direct-conversion receiver with local-oscillator phase interleaving and baseband de-interleaving, in accordance with one embodiment.

Turning to one embodiment in FIG. 3, a differential direct-conversion architecture and associated method are provided with two switching matrices: 1) the local oscillator phase interleaver (LOPI) 310 circuit, and 2) the baseband de-interleaver (BBDI) 330. Each has four combinations of connections. The four combinations of LOPI are illustrated in FIGS. 4a, 4b, 4c and 4d. In keeping with the terminology established in the previous example, the polyphase LO signals 306, 307, 308, 309 are denoted: $LO^0$, $LO^{90}$, $LO^{180}$, $LO^{270}$.

To establish additional notation to unify the description the signals in FIG. 3 and FIG. 4, in FIG. 3 the positive input 313 to the first mixer 341 will be denote M1+ in FIG. 4. Likewise, in FIG. 3 the negative input 314 to the first mixer 341 will be denoted M1− in FIG. 4. Likewise, in FIG. 3 the positive input 315 to the second mixer 340 will be denoted M2+ in FIG. 4. Likewise, in FIG. 3 the negative input 316 to the second mixer 340 will be denoted M2− in FIG. 4.

Figure 4A:
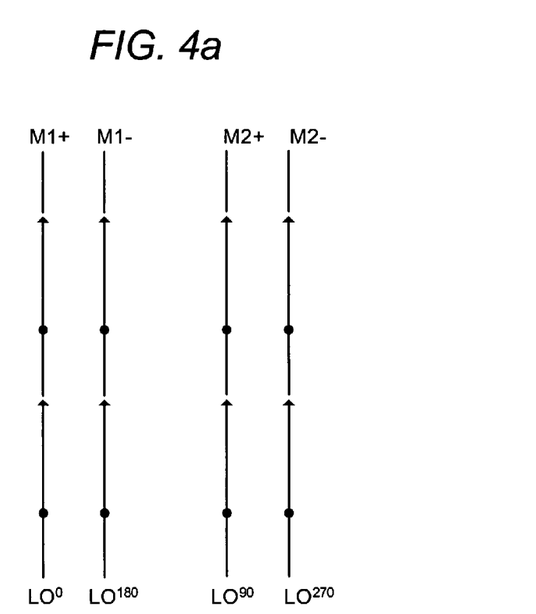
FIGS. 4a–d show the four configurations of the local-oscillator phase interleaver of FIG. 3.
Figure 4B:
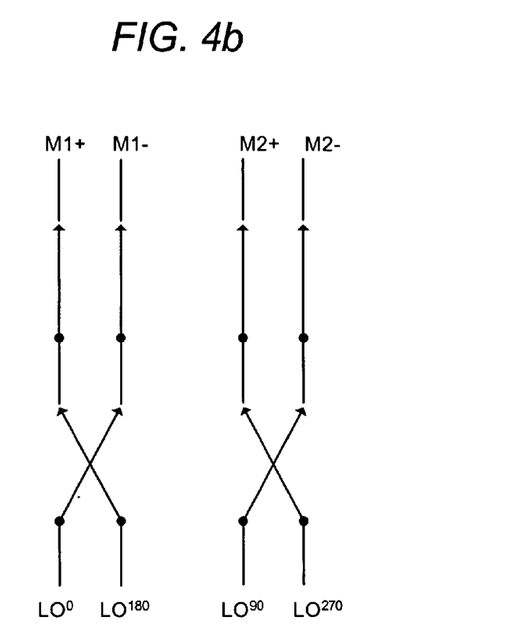
Figure 4C:
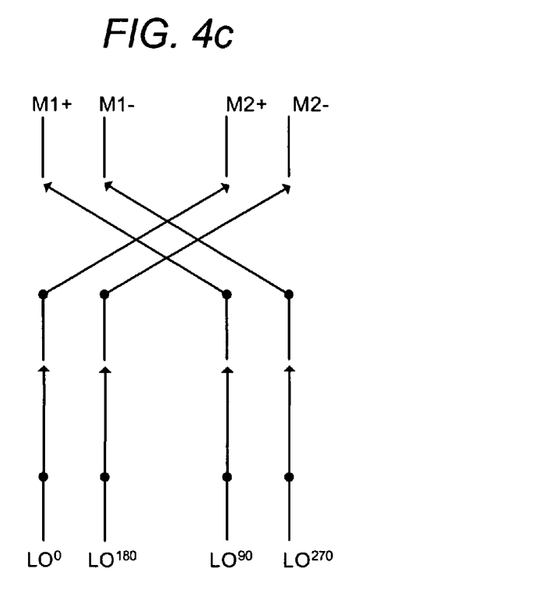
Figure 4D:
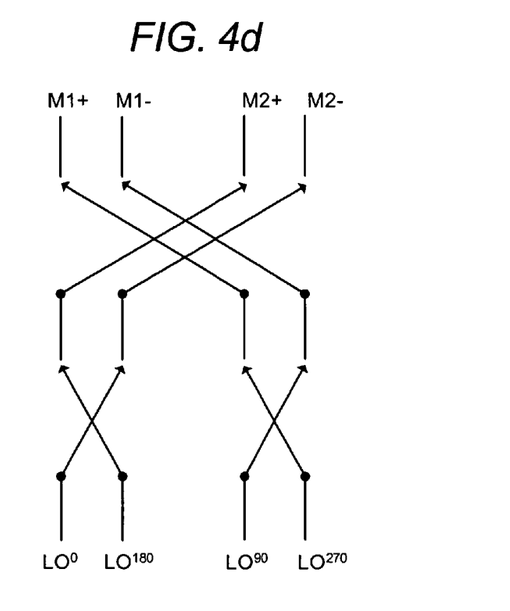

In state 1 as illustrated in FIG. 4a, the local oscillator phase interleaver passes $LO^0$, $LO^{180}$, $LO^{90}$, $LO^{270}$ through to M1+, M1−, M2+, M2− respectively. In the second state as illustrated in FIG. 4b, the LO phase interleaver routes $LO^{180}$, $LO^0$, $LO^{270}$, $LO^{90}$ through to M1+, M1−, M2+, M2− respectively. In state 3 as illustrated in FIG. 4c, $LO^{90}$, $LO^{270}$, $LO^0$, $LO^{180}$ are routed to M1+, M1−, M2+, M2− respectively, Finally in state 4 as illustrated in FIG. 4d, $LO^{270}$, $LO^{90}$, $LO^{180}$, $LO^0$ are routed to M1+, M1−, M2+, M2− respectively.

Through this method, each mixer input sees each polyphase LO signal $LO^0$, $LO^{90}$, $LO^{180}$, $LO^{270}$. Thus, if a phase or amplitude imbalance of one mixer distorts one LO component then it distorts all components. For the four states, the output of the first mixer 341 is described by Equations 13, 14, 15 and 16, and the output of the second mixer 340 is described by Equations 17, 18, 19, and 20.

State 1: $(RF_{pos}-RF_{neg}) \times (LO^0-LO^{180}) \times A1e^{jP1}+DC1$    Equation 13

State 2: $(RF_{pos}-RF_{neg}) \times (LO^{180}-LO^0) \times A1e^{jP1}+DC1$    Equation 14

State 3: $(RF_{pos}-RF_{neg}) \times (LO^{90}-LO^{270}) \times A1e^{jP1}+DC1$    Equation 15

State 4: $(RF_{pos}-RF_{neg}) \times (LO^{270}-LO^{90}) \times A1e^{jP1}+DC1$    Equation 16

State 1: $(RF_{pos}-RF_{neg}) \times (LO^{90}-LO^{270}) \times A2e^{jP2}+DC2$    Equation 17

State 2: $(RF_{pos}-RF_{neg}) \times (LO^{270}-LO^{90}) \times A2e^{jP2}+DC2$    Equation 18

State 3: $(RF_{pos}-RF_{neg}) \times (LO^0-LO^{180}) \times A2e^{jP2}+DC2$    Equation 19

State 4: $(RF_{pos}-RF_{neg}) \times (LO^{180}-LO^0) \times A2e^{jP2}+DC2$    Equation 20

In the context of the present description, "interleaving" may refer to the plain and ordinary meaning thereof, as well as any sort of switching, exchanging, toggling, swapping, interchanging, etc.

The BBDI 330 undoes the interleaving that the LOPI introduced. The baseband de-interleaver 330 circuit interleaves between one of four combinations of connections illustrated in FIGS. 5a–d. In addition, in two of the states it inverts the incoming signal. To clarify the corresponding notations between FIG. 3 and FIG. 5, in FIG. 3 the positive output 317 of the first mixer 341 corresponds to the notation B1 in FIG. 5. Likewise, in FIG. 3 the negative output 318 of the first mixer 341 corresponds to the notation B2 in FIG. 5. Likewise, in FIG. 3 the positive output 319 of the second mixer 340 corresponds to the notation B3 in FIG. 5. Likewise, in FIG. 3 the negative output 320 of the second mixer 340 corresponds to the notation B4 in FIG. 5.

To further clarify the corresponding notations between FIG. 3 and FIG. 5, in FIG. 3 the positive in-phase baseband input 332 to the first low pass filter 342 corresponds to the notation B5 in FIG. 5. Likewise, in FIG. 3 negative in-phase baseband input 333 to the first low pass filter 342 corresponds to the notation B6 in FIG. 5. Likewise, in FIG. 3 positive quadrature baseband 334 input to the second low pass filter 343 corresponds to the notation B7 in FIG. 5. Likewise, in FIG. 3 negative quadrature baseband input to the second low pass filter 342 corresponds to the notation B8 in FIG. 5.

Figure 5A:
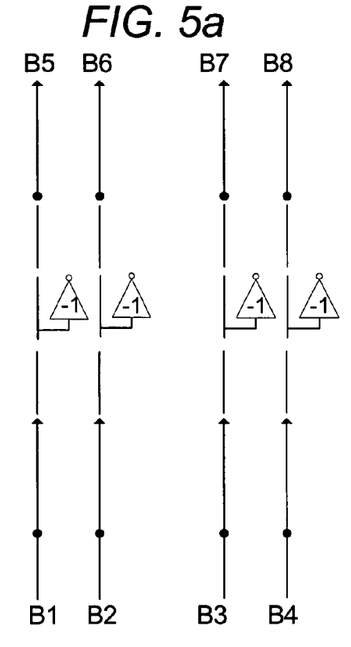
FIGS. 5a–d show the four configurations of the baseband de-interleaver of FIG. 3.
Figure 5B:
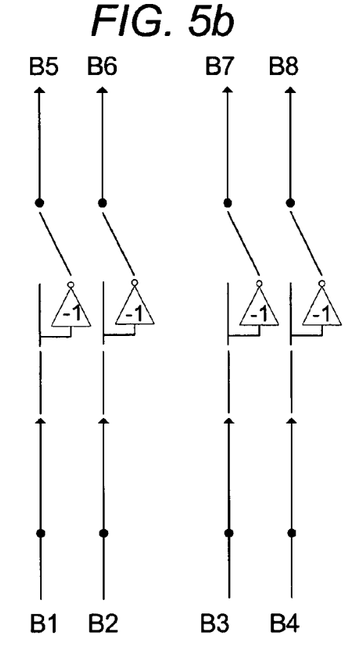
Figure 5C:
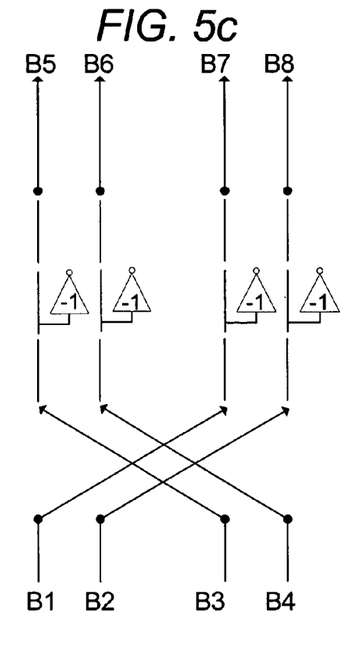
Figure 5D:
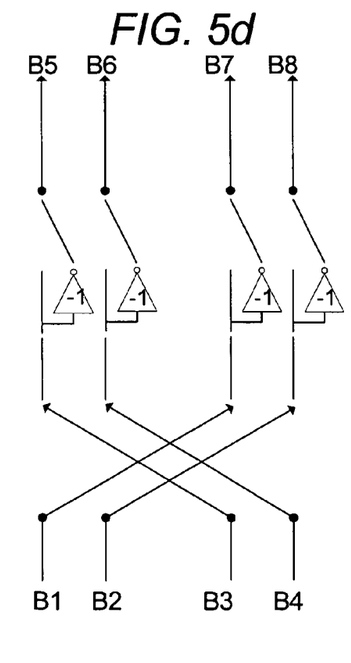

In state 1 illustrated in FIG. 5a, the baseband de-interleaver passes B1, B2, B3, B4 through to B5, B6, B7, B8 respectively. In the second state illustrated in FIG. 5b, the baseband de-interleaver inverts the incoming signals and routes B1, B2, B3, B4 to B5, B6, B7, B8 respectively. In state 3 illustrated in FIG. 5c, B3, B4, B1, B2 are routed to B5, B6, B7, B8 respectively. Finally, in state 4 illustrated in FIG. 5d, the baseband de-interleaver inverts the incoming signals and routes B3, B4, B1, B2 to B5, B6, B7, B8 respectively.

Returning to FIG. 3, the in-phase baseband signal is comprised of differential signals 332, 333. Likewise the quadrature baseband signal is comprised of differential signals 334, 335. For the four states, the in-phase baseband signal is described by Equations 21, 22, 23, and 24. Likewise, the quadrature baseband signal is described by Equations 25, 26, 27, and 28.

State 1: $(RF_{pos}-RF_{neg}) \times (LO^0-LO^{180}) \times A1e^{jP1}+DC1$    Equation 21

State 2: $(RF_{pos}-RF_{neg}) \times (LO^0-LO^{180}) \times A1e^{jP1}-DC1$    Equation 22

State 3: $(RF_{pos}-RF_{neg}) \times (LO^0-LO^{180}) \times A2e^{jP2}+DC2$    Equation 23

State 4: $(RF_{pos}-RF_{neg}) \times (LO^0-LO^{180}) \times A2e^{jP2}-DC2$    Equation 24

State 1: $(RF_{pos}-RF_{neg}) \times (LO^{90}-LO^{270}) \times A2e^{jP2}+DC2$    Equation 25

State 2: $(RF_{pos}-RF_{neg}) \times (LO^{90}-LO^{270}) \times A2e^{jP2}-DC2$    Equation 26

State 3: $(RF_{pos}-RF_{neg}) \times (LO^{90}-LO^{270}) \times A1e^{jP1}+DC1$    Equation 27

State 4: $(RF_{pos}-RF_{neg}) \times (LO^{90}-LO^{270}) \times A1e^{jP1}+DC1$    Equation 28

A higher-order delta-sigma modulator 321 running off a clock 322 higher than the RF signal 300 modulation bandwidth is used to choose the LOPI and BBDI state. The delta-sigma modulator 321 generates a pseudo-random number from 1 to 4. As an example, a Bluetooth™ signal's bandwidth is 1 MHz, thus the interleaving may occur faster than 1 MHz such as 10 MHz. To continue the example, the delta-sigma pseudo random number modulator 321 would generate 10 million random numbers per second; these numbers generated from the set 1, 2, 3 and 4. Delta-sigma pseudo random numbers force the switching noise to higher frequencies. As an option, the numbers may be completely random.

For the in-phase signal component, the DC offset has 4 values DC1, −DC1, DC2, −DC2 corresponding to states 1, 2, 3, 4 respectively. Likewise the quadrature baseband signal has 4 DC offset values each corresponding to a different interleaving combination. The amplitude and phase imbalance distortion has two values for the in-phase baseband signal: $A1e^{jP1}$ for states 1 and 2 and $A2e^{jP2}$ for states 3 and 4. The quadrature baseband signal follows the opposite pattern for amplitude and phase imbalance.

Since a low pass filter can be interpreted as a time averaging function, the DC offset introduced by the mixers is averaged out in the baseband signals. With equal numbers of switching matrix states occurring, the DC offset is removed. This is summarized in the Equation 29.

$DC_{M1}-DC_{M1}+DC_{M2}-DC_{M2}=0$    Equation 29

Similarly, the in-phase and quadrature baseband signal imbalances average to the same value denoted in Equations 30 and 31.

$BB_I=RF \times LO_I \times (A1e^{jP1}+A1e^{jP1}+A2e^{jP2}+A2e^{jP2})$    Equation 30

$BB_Q=RF \times LO_Q \times (A1e^{jP1}+A1e^{jP1}+A2e^{jP2}+A2e^{jP2})$    Equation 31

So while the amplitude and phase distortion are still present in the I and Q baseband signals, the distortion is now equal in the I and Q baseband signals. Since the signals are balanced, the amplitude and phase distortion does not degrade the system performance. With only the addition of a complex multiplicative term, Equations 30 and 31 are identical to Equations 1 and 2 which are the expressions for an ideal direct-conversion receiver.

The present technology thus provides a solution for important drawbacks of a direct-conversion receiver: DC offset and quadrature imbalance.

Figure 6:
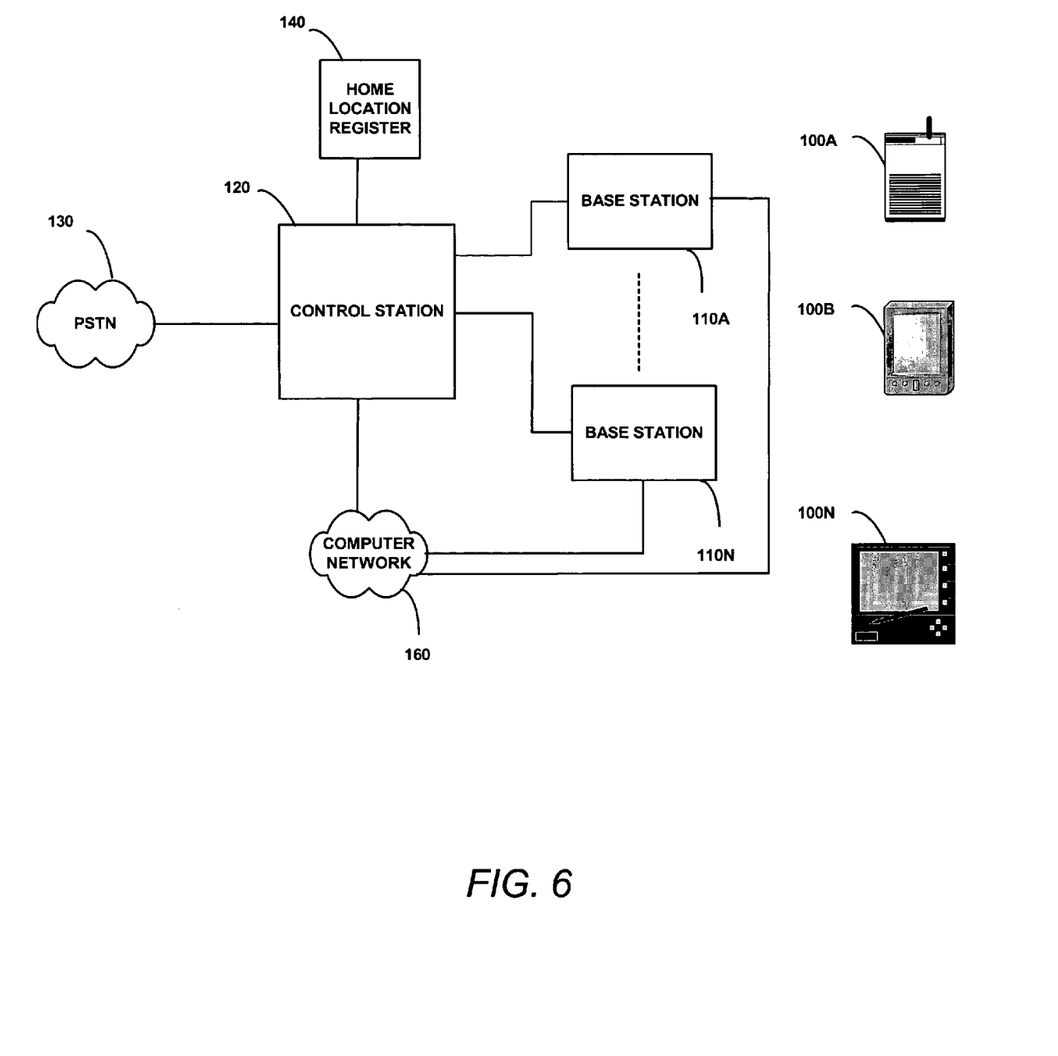
FIG. 6 is an illustration of a wireless communication system in which one embodiment may be used.

FIG. 6 is an illustration of a multi-mode wireless communication system in which one embodiment may be used. It should be understood that the components shown in FIG. 6 are merely representative of one mode of wireless communication system and that other communication systems may use different components in order to achieve similar, or even different results. For example, a wired transceiver communication system may also be employed. The claims, therefore, are not intended to be limited to the system shown in FIG. 6. For example, the present technology may be implemented in a single-mode system.

In the wireless communication system of FIG. 6, multi-mode, wireless communication devices, otherwise referred to herein simply as wireless communication devices, are shown as wireless communication devices 100a, 100b, and 100n, one or more wireless communication devices being assigned to each user in the system. The designations a, b, and n on the wireless communication device identifiers correspond respectively to a first user, a second user, and an nth user, representing "n" number of users in the communication system. Although only three wireless communication devices 100 are shown in FIG. 6, it should be understood that a wireless communication system typically comprises many thousands of users.

Referring again to FIG. 6, control station 120 typically includes interface and processing circuitry for providing system control to base stations 110a through 110n, representing one through "n" base stations comprising the wireless communication system. Base stations are provided for transmitting and receiving communication signals to and from wireless communication devices. Each base station 110 provides a coverage area ranging up to several miles in radius from the base station location. As wireless communication devices travel within the coverage area of each base station, communication signals to be transferred to and from the wireless communication device are routed generally through the particular base station to which the wireless communication device is most closely located.

Control station 120 provides circuitry for routing communications between wireless communication devices operating in various base station coverage areas, as well as between remote stations and land-line telephone users through a Public Switch Telephone Network, shown in FIG. 6 as the PSTN 130. Control station 120 may, alternatively, or in addition to, be connected to computer network 160 to provide communications between wireless communication devices in the communication system and various known computing devices connected to computer network 160, such as personal computers, mainframe computers, digital cameras, email systems, remotely controlled devices, and so on.

Control station 120 typically comprises a telecommunications switch (not shown) and a Base Station Controller (BSC) (also not shown). The telecommunication switch provides a switching interface to PSTN 130 while the BSC provides the necessary hardware and software for communications to take place between base stations. Control station 120 provides other functions in the communication system as well, such as billing services and data services.

Control station 120 may be coupled to the base stations by various means such as dedicated telephone lines, optical fiber links, or microwave communication links. When a call is initiated by a wireless communication device, a paging message is transmitted to one or more base stations proximate to the wireless communication device initiating the call, generally over a paging channel. The paging message is routed to control station 120, where it is processed and routed either to PSTN 130 or to one or more base stations proximate to a wireless communication device for which the call is intended. When a call is initiated from PSTN 130, a paging message is received by control station 120 where it is then converted into a format suitable for the particular wireless communication system.

In the exemplary embodiment, the wireless communication device 100 is able to communicate in at least two modes, or types, of communications, data communications and voice communications. Data communication mode is used when it is desirous to send or receive information generally suitable for digital computational devices, such as laptop computers. Data is generally transmitted in discreet segments called packets. Each data packet generally contains overhead information used for a variety of purposes. For example, many data packets contain a data field used to store an error detection code. The error detection code may be used to check a received data packet to ensure that it was received intact; that is, the data was not corrupted during the transmission process.

Voice communication mode is used when it is desirous to transmit acoustic information, including human speech, facsimile tones, music, or other audible forms of communication. In voice communication mode, audio information is transmitted using one or more well-known wireless communication modulation techniques, such as CDMA, TDMA, AMPS, and others.

During typical voice communications, an over the air channel is established between one or more base stations and a wireless telephone. The channel is maintained throughout the duration of the voice call, no matter how much or little voice activity is occurring between the wireless telephone and the base station. In many instances, voice data is digitized and formatted into packets prior to transmission. Voice packets differ from data packets in that no information as to a destination address is contained within the voice packets. That is, a connection is first established between two locations, then voice data is transmitted between the two locations. No address information need be contained within the voice packets as the source and destination of the voice packets are predetermined by the connection.

Data mode may further include a capability of transmitting voice in certain applications. In this scenario, voice is digitized using techniques well known in the art. The digitized voice signals may be encrypted to provide for secure voice transmissions over the air. The digitized voice signals are then formatted into data packets, which are then transmitted over the air using well-known data transmission protocols. As explained above, each data packet contains information as to the address, or destination, of where the data packet is to arrive.

Figure 7:
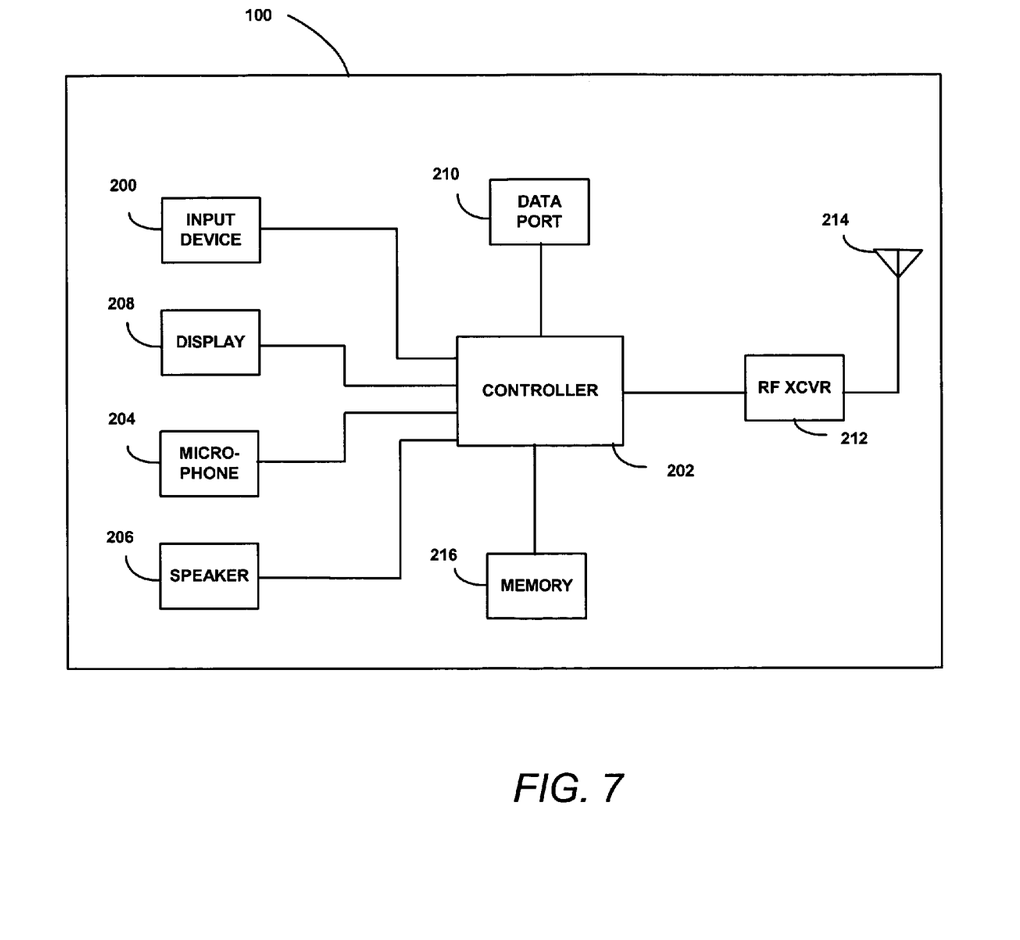
FIG. 7 illustrates the functional components of a wireless communication device, shown in block diagram format.

FIG. 7 illustrates the functional components of a wireless communication device, or wireless communication device, 100, shown in block diagram format. It should be understood that the components shown in FIG. 7 are merely representative of one mode of wireless communication device and that other communication devices may use different components in order to achieve similar, or even different results. The claims, therefore, are not intended to be limited to the system shown in FIG. 7.

Wireless communication device 100 is capable of multi-mode communications, meaning that it can operate in several modes of communications, such as voice communications or data communications. It should be understood that voice communications comprise any audio information including speech, music, or audible tones used for call processing, modems, and facsimile machines. Data communications comprise synchronous or asynchronous data transmission. In addition to these modes, wireless communication device is also capable of other modes of communications as well.

A user of wireless communication device 100 initiates communications generally by using input device 200. Input device 200 comprises a keypad in the exemplary embodiment, however, input device 200 could be any device which accepts user commands, such as a voice response device which converts voice commands into electrical signals suitable for processing by controller 202. During voice communications, the user speaks into microphone 204, which transforms acoustic energy into electrical energy and sends the electrical signals to controller 202 for processing.

Microphone 204 may be substituted for input device 200 in an application where a second audio input device is undesirable. In many instances, a voice encoder/decoder, generally known as a Codec, is used between microphone 204 and controller 202, or is incorporated within controller 202, to convert the electrical signals from microphone 204 into a format more suitable for transmission over a limited bandwidth air interface.

Speaker 206 is used to convert received electrical signals into acoustic signals. Speaker 206 may comprise a speaker suitable for low volume acoustic outputs, typically for use in a traditional telephone application, or speaker 206 may comprise a loudspeaker, suitable for high volume acoustic outputs, typically for use in a dispatch applications. In another embodiment, speaker 206 may comprise a combination of the high volume and low volume acoustic speakers.

Wireless communication device 100 further comprises display 208 for allowing a user to view operational characteristics of the wireless communication device. Such displays are common in many of today's wireless devices including telephones and remote data terminals.

Data port 210 serves as an interface between controller 202 and external hardware devices. Data port 210 generally allows a variety of bi-directional data communications to take place between wireless communication device 100 and the external device. Such external devices include laptop computers, facsimile machines, and remote data terminals, among others.

When a user initiates voice or data communications, an identification code corresponding to a second communication device, generally a telephone number, is entered using input device 200. In the exemplary embodiment, input device 200 comprises keys corresponding to digits 0 through 9, as well as additional function keys, such as SEND, END, and so forth. Input device 200 may also comprise one or more keys used to classify an outgoing communication as being a data communication or a voice communication.

For example, a user wishing to initiate a data communication might press a key designated for data communications, then dial a telephone number corresponding to a data device that the user wishes to communicate with. In one embodiment, all calls from wireless communication device 100 are assumed to be voice calls, unless classified as some other mode of communication, as described by one of the methods above.

Controller 202 serves as the main computational unit of wireless communication device 100. Although controller 202 is shown as a single element in FIG. 7, it should be understood that controller 202 may comprise one or more individual components such as one or more Application Specific Integrated Circuits (ASICs) in combination with memory devices, bus controllers, and other support devices well known to those skilled in the art.

To facilitate the transmission and receipt of wireless RF signals in the foregoing context, an RF transceiver 212 and an antenna 214 are coupled to controller 202 for sending and receiving such signals. Similar to the controller 202, one or more ASICs in combination with memory devices, bus controllers, etc. may be used to provide the RF transceiver 212. Moreover, the aforementioned direct-conversion receiver may be incorporated into the RF transceiver 212 and/or controller 202 in any desired capacity for providing an improved system.

Working in conjunction with the controller 202 is memory 216. The memory 216 is a device used to store information represented in digital format. Examples of memory 216 include random access memory (RAM), electrically erasable programmable read-only memory (EEPROM), non-volatile memory, and other known storage devices.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method for direct-conversion of a modulated radio-frequency (RF) signal, comprising:
   receiving an RF signal; and
   mixing the RF signal with a plurality of oscillator signals with different phases in an interleaving manner to produce a plurality of baseband signals, each of the plurality of baseband signals including interleaved in-phase and quadrature baseband signals.

2. The method as recited in claim 1, wherein the RF signal is converted to a differential RF signal.

3. The method as recited in claim 1, wherein the oscillator signals include an oscillator signal frequency substantially equal to an RF signal frequency of the RF signal.

4. The method as recited in claim 1, wherein the RF signal is modulated over a finite bandwidth.

5. The method as recited in claim 1, wherein the oscillator signals have phase differences of 0, 90, 180, and 270 degrees.

6. The method as recited in claim 1, wherein the mixing is carried out by a plurality of mixers.

7. The method as recited in claim 6, wherein the oscillator signals are input to the mixers in the interleaving manner.

8. The method as recited in claim 7, wherein the oscillator signals are input to the mixers in the interleaving manner by switching which oscillator signals are input to which mixers.

9. The method as recited in claim 8, wherein the switching occurs at a rate that is faster than a bandwidth of the RF signal.

10. The method as recited in claim 8, wherein the switching occurs in a substantially random manner.

11. The method as recited in claim 10, wherein the switching occurs in a random manner.

12. The method as recited in claim 1, wherein a modulation of the RF signal is reconstructed as a baseband signal using a de-interleaving operation applied to the plurality of baseband signals.

13. The method as recited in claim 12, wherein an in-phase baseband signal and a quadrature baseband signal is generated by the reconstruction.

14. The method as recited in claim 12, wherein the de-interleaving operation includes inverting and routing operations.

15. The method as recited in claim 13, wherein low-pass filtering is applied to the in-phase baseband signal and the quadrature baseband signal.

16. The method as recited in claim 15, wherein a direct current (DC) offset of the in-phase baseband signal and the quadrature baseband signal is removed.

17. The method as recited in claim 15, wherein an amplitude distortion and a phase distortion of the in-phase baseband signal and the quadrature baseband signal are equated.

18. A direct-conversion subsystem, comprising:
   means for receiving an RF signal; and
   means for mixing the RF signal with a plurality of oscillator signals with different phases in an interleaving manner to produce a plurality of baseband signals, each of the plurality of baseband signals including interleaved in-phase and quadrature baseband signals.

19. A method for direct-conversion of a modulated signal, comprising:
   receiving a signal; and
   mixing the signal with a plurality of oscillator signals with different phases in an interleaving manner to produce a plurality of baseband signals, each of the plurality of baseband signals including interleaved in-phase and quadrature baseband signals.

20. A direct-conversion subsystem, comprising:
   a first mixer configured to receive an RF signal;
   a second mixer configured to receive the RF signal;
   a Local Oscillator (LO) configured to generate an oscillator signal;
   a polyphase network coupled to the LO and configured to generate a plurality of LO signals at different phases relative to the oscillator signal; and
   an LO phase interleaver configured to selectively couple each of the plurality of LO signals to the first and second mixers in an interleaving manner to generate baseband signals at the output of the first mixer and the second mixer, the baseband signals including interleaved in-phase and quadrature baseband signals based on the interleaving manner.

* * * * *